(12) United States Patent
Brochhaus

(10) Patent No.: US 9,194,917 B2
(45) Date of Patent: Nov. 24, 2015

(54) METHOD FOR TRANSMITTING DATA BETWEEN A CONTROL DEVICE AND AT LEAST ONE MEASUREMENT DEVICE BY MEANS OF A BUS SYSTEM, AND A BATTERY MANAGEMENT UNIT

(71) Applicants: Robert Bosch GmbH, Stuttgart (DE); Samsung SDI Co., Ltd., Yongin-si, Gyeonggi-do (KR)

(72) Inventor: Christoph Brochhaus, Aachen (DE)

(73) Assignee: Robert Bosch GmbH, Stuttgart (DE)

( * ) Notice: Subject to any disclaimer, the term of this patent is extended or adjusted under 35 U.S.C. 154(b) by 203 days.

(21) Appl. No.: 14/048,129

(22) Filed: Oct. 8, 2013

(65) Prior Publication Data

US 2014/0097851 A1     Apr. 10, 2014

(30) Foreign Application Priority Data

Oct. 9, 2012   (DE) .......................... 10 2012 218 330

(51) Int. Cl.
*H01M 10/44*     (2006.01)
*H01M 10/46*     (2006.01)
*G01R 31/36*     (2006.01)
*H04L 12/40*     (2006.01)

(52) U.S. Cl.
CPC ............ *G01R 31/3606* (2013.01); *H04L 12/40* (2013.01); *H04L 2012/40273* (2013.01)

(58) Field of Classification Search
CPC ................. H02J 2007/0037; H02J 2007/0039; H02J 2007/004; H02J 7/0021; H02J 7/0026
USPC .......... 320/104, 107, 132, 134, 136; 324/426, 324/427, 433
See application file for complete search history.

(56) References Cited

U.S. PATENT DOCUMENTS

| | | | |
|---|---|---|---|
| 4,514,694 A | * | 4/1985 | Finger ........................... 324/429 |
| 5,300,093 A | * | 4/1994 | Koestner et al. ................ 607/32 |
| 2007/0182377 A1 | * | 8/2007 | Vandensande ................ 320/132 |

* cited by examiner

*Primary Examiner* — Edward Tso
(74) *Attorney, Agent, or Firm* — Maginot, Moore & Beck LLP

(57) ABSTRACT

The disclosure provides a method for transmitting data between a control device and at least one measurement device via a bus system. The method includes recording first measurement data relating to at least one measurement variable with the at least one measurement device with a first measurement data resolution within a first measurement cycle, transmitting the recorded first measurement data to the bus system at a first measurement frequency within the first measurement cycle. The method further includes recording second measurement data relating to the at least one measurement variable with the at least one measurement device with a second measurement data resolution within a second measurement cycle. The second measurement data resolution is less than the first measurement data resolution. The method also includes transmitting the recorded second measurement data to the bus system at a second measurement frequency within the second measurement cycle.

10 Claims, 2 Drawing Sheets

METHOD FOR TRANSMITTING DATA BETWEEN A CONTROL DEVICE AND AT LEAST ONE MEASUREMENT DEVICE BY MEANS OF A BUS SYSTEM, AND A BATTERY MANAGEMENT UNIT

This application claims priority under 35 U.S.C. §119 to patent application no. DE 10 2012 218 330.2, filed on Oct. 9, 2012 in Germany, the disclosure of which is incorporated herein by reference in its entirety.

BACKGROUND

The present disclosure relates to a method for transmitting data between a control device and at least one measurement device by means of a bus system, wherein the measurement data resolution and the measurement frequency of the measurement device can be dynamically adjusted, and also to a battery management unit.

It is becoming apparent that battery systems or batteries on which very strict requirements in respect of reliability are made will increasingly be used in the future, both in stationary applications and also in vehicles such as hybrid and electric vehicles. The reason for said strict requirements is that failure of the battery can lead to a safety-critical problem.

In order to be able to guarantee the reliability of a battery system, the battery cells and battery modules of said battery system are monitored by electronic measurement and control devices. Nowadays, electronic measurement devices and/or control devices are increasingly being used in the automobile sector in particular. Examples of said electronic measurement devices and control devices are the engine control device, ABS control devices or the control device for the airbag of a vehicle. The development of batteries and/or battery systems with an associated battery management system which comprises measurement and control devices with software for monitoring the battery functionality is also required for electrically driven vehicles. Batteries of this kind have a wide variety of topologies, based on the number and arrangement of the battery cells and/or battery modules and sensors or measuring devices of said batteries, depending on the customer requirements or the installation space available.

Typical battery management systems monitor and control the currents, the voltages, the temperatures, the insulation resistance and other variables of the battery cells and battery modules. Management functions which increase the service life, reliability and safety of the battery system can then be executed with the inclusion of these variables. The majority of battery management systems known from the prior art have a control device topology with a central control device (also called main control device) and a plurality of subordinate sensor control devices. In order to detect measurement data relating to the various measurement variables of the battery cells, the sensor control devices are connected to measurement devices or are contained in said measurement devices, that is to say they are, for example, built into the measurement devices. In this case, measurement variables can be, as mentioned, for example, voltages, temperatures or currents of the battery cells and/or battery modules which are measured and/or detected directly at said battery cells and/or battery modules. The detected measurement data is transmitted from the measurement devices, by means of a bus system (for example by means of a CAN bus), to the central control device or to the main control device. To this end, the measurement data which is recorded by the measurement devices and which has a specific measurement data resolution is transmitted to the bus system at a predetermined measurement frequency.

The total amount of measurement data which can be transported on the communication bus over a specific time is limited by the use of a bus system with a defined bandwidth. As a result, the transmission of measurement data from the measurement devices to the central control device is restricted. For example, a greater quantity of data has to be transported in the case of a high level of measurement accuracy, that is to say at a high measurement data resolution, than at a lower measurement data resolution. Furthermore, the additional communication by other bus subscribers by means of the bus system further restricts the available bandwidth of the bus system. This additional communication may be, for example, diagnosis or control commands which the central control device transmits to the sensor control devices and/or measurement devices by means of the bus system.

As a result, the maximum measurement frequency is also determined when selecting a measurement data resolution during the design of the software. In this case, it is no longer possible to pass or transmit all the measurement data to the bus system at a relatively high measurement frequency.

SUMMARY

The disclosure provides a method for transmitting data between a control device and at least one measurement device by means of a bus system, wherein the method comprises the following method steps: a first measurement cycle being initialized, measurement data relating to at least one measurement variable being recorded by the at least one measurement device with a first measurement data resolution $A_1$ within the first measurement cycle, the recorded measurement data being transmitted to the bus system at a first measurement frequency $f_1$ within the first measurement cycle. According to the disclosure, the method further comprises the following method steps: a second measurement cycle being initialized, measurement data relating to the at least one measurement variable being recorded by the at least one measurement device with a second measurement data resolution $A_2$ within the second measurement cycle, where $A_2 < A_1$, the recorded measurement data being transmitted to the bus system at a second measurement frequency $f_2$ within the second measurement cycle, where $f_2 > f_1$.

The advantage of a method of this kind is that the measurement data resolution with which a measurement device detects measurement data and the measurement frequency at which said measurement device transmits measurement data to the bus system can be automatically dynamically adjusted by selecting specific operating modes. If, for example, only a low level of measurement data accuracy or a low measurement data resolution is required, the measurement frequency can be increased in a flexible manner. Similarly, highly accurate measurements can be performed by the measurement data resolution being increased and the measurement frequency accordingly being reduced.

In a preferred further development of the above method for transmitting data between a control device and at least one measurement device by means of a bus system, the method also comprises the method step of initializing a third measurement cycle. The method further comprises the method step of measurement data relating to the at least one measurement variable being recorded by the at least one measurement device with a third measurement data resolution $A_3$ within the third measurement cycle, where $A_2 < A_3 < A_1$. The method also comprises the method step of the recorded measurement data being transmitted to the bus system at a third measurement frequency $f_3$ within the third measurement cycle, where $f_2 > f_3 > f_1$.

In this way, both the measurement data resolution and also the measurement frequency can be reduced in a third operating mode in order to create free spaces for the transmission of control signals, for example by the central control device on the bus.

A first and/or a second and/or a third measurement cycle are/is preferably initialized by a control signal in each case being generated by the control device and being transmitted to the at least one measurement device. As a result, the method which is executed by the at least one measurement device can be controlled by the control device, for example the central control device of a battery system.

The first measurement data resolution $A_1$ preferably corresponds to the maximum selectable measurement data resolution and/or the second measurement data resolution $A_2$ preferably corresponds to the minimum selectable measurement data resolution and/or the third measurement data resolution $A_3$ preferably corresponds to a selectable average measurement data resolution of the at least one measurement device. The method becomes more efficient by suitable selection of the first, second and third measurement data resolution $A_1$, $A_2$ and $A_3$.

In a preferred embodiment of the method, the average measurement data resolution is given by the arithmetic mean of the minimum selectable measurement data resolution and the maximum selectable measurement data resolution. As a result, the average measurement data resolution is selected to be exactly between the maximum and the minimum selectable measurement data resolution of the measurement device. Therefore, measurement data or measurement data sets containing an extremely small, average or extremely large amounts of measurement data can be generated and transmitted to the bus system, depending on requirements and/or depending on the present application.

The first measurement frequency $f_1$ preferably corresponds to the minimum selectable measurement frequency and/or the second measurement frequency $f_2$ preferably corresponds to the maximum selectable measurement frequency and/or the third measurement frequency $f_3$ preferably corresponds to a selectable average measurement frequency of the at least one measurement device. The measurement frequency can be matched to the selected measurement data resolution by virtue of an embodiment of the method of this kind. Therefore, there are three different measurement modes in which the measurement frequency and the measurement data resolution are matched to one another in each case.

The average measurement frequency is preferably given by the arithmetic mean of the maximum selectable measurement frequency and the minimum selectable measurement frequency. As a result, the average measurement frequency is selected to be exactly between the maximum selectable measurement frequency and the minimum selectable measurement frequency.

The disclosure also provides a battery management unit which is designed to execute the method according to the disclosure.

The disclosure further provides a battery having a battery management unit according to the disclosure, wherein the battery is particularly preferably designed as a lithium-ion battery. Advantages of batteries of this type include, amongst other things, their comparatively high energy density and also their high level of thermal stability. A further advantage of lithium-ion batteries is that they are not subject to a memory effect.

The disclosure also provides a motor vehicle comprising a battery having a battery management unit according to the disclosure, wherein the battery is connected to a drive system of the motor vehicle.

Advantageous developments of the disclosure are specified in the dependent claims and described in the description.

BRIEF DESCRIPTION OF THE DRAWINGS

Exemplary embodiments of the disclosure will be explained in greater detail with reference to the drawings and the following description. In the drawings.

DETAILED DESCRIPTION

Figure 1:
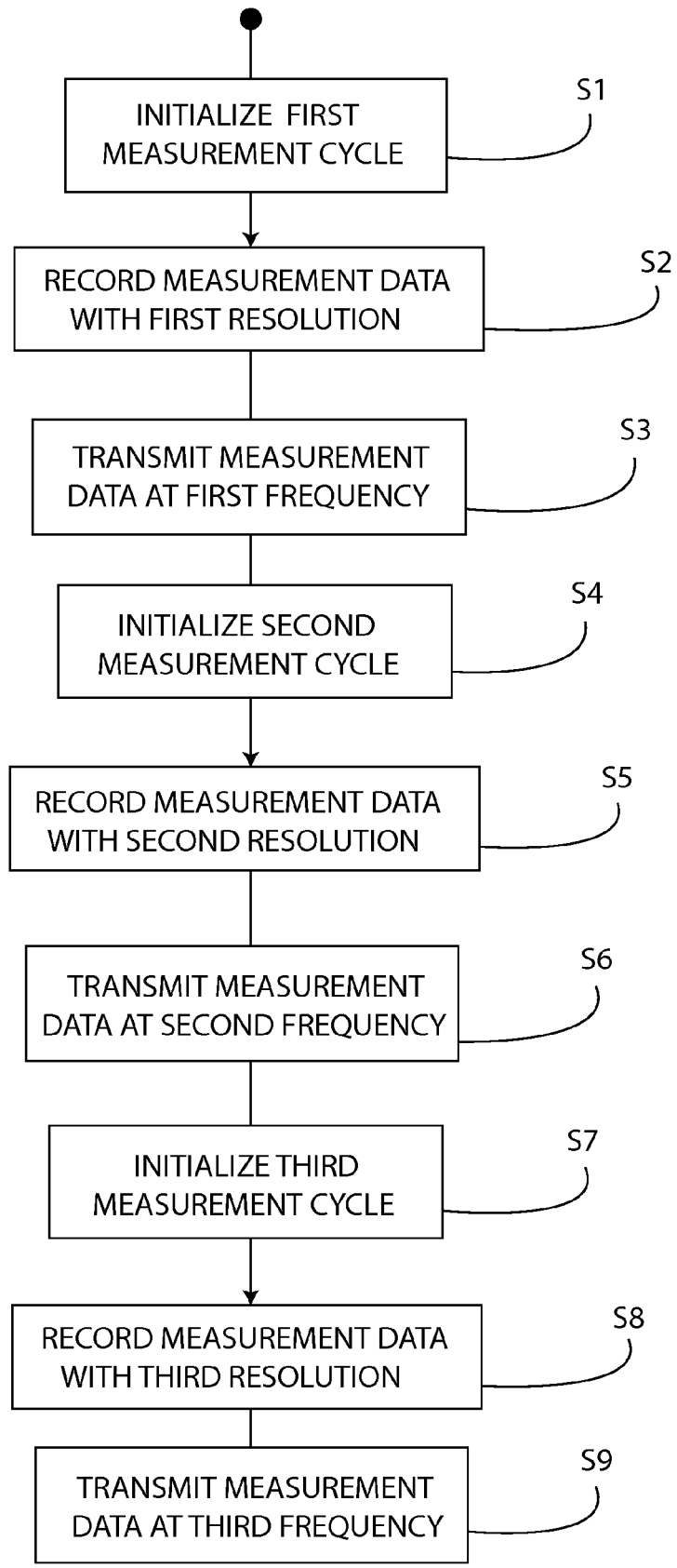
FIG. 1 shows an exemplary embodiment of the method according to the disclosure with one measurement device.

FIG. 1 shows an exemplary embodiment of the method according to the disclosure with one measurement device. In this exemplary embodiment, the disclosure is executed purely by way of example by a control device which is realized as a battery management unit and is arranged within a battery management system and is connected to a measurement device by means of a bus system. The measurement device, for its part, is connected to a battery cell of a battery module and is designed for the purpose of detecting measurement data relating to three different measurement variables of the battery cell. In this exemplary embodiment, these measurement variables correspond to the battery cell voltage, the battery cell current and the battery cell temperature. In this exemplary embodiment, the measurement device has a sensor for detecting the measurement variables and also a sensor control device.

In this exemplary embodiment, the method begins with the initialization of a first measurement cycle, S1, which is performed, in this exemplary embodiment, by a control signal being generated by the control device and being transmitted to the measurement device. Therefore, in this exemplary embodiment, a corresponding control signal is generated by the control device and said control signal is sent to the measurement device by means of the bus system in order to initialize a measurement cycle. During the first measurement cycle, the measurement device records measurement data relating to three measurement variables of the battery cell with a first measurement data resolution $A_1$, S2. In this exemplary embodiment, the measurement device therefore detects measurement data relating to the battery cell voltage, the battery cell current and the battery cell temperature during the second method step, wherein this measurement data has a measurement data resolution $A_1$. In the next method step, the detected measurement data is transmitted to the bus system at a first measurement frequency $f_1$ within the first measurement cycle, S3. The measurement data is therefore copied to the bus system at a first measurement frequency $f_1$. In this case, the measurement data which is detected in respect of the battery cell voltage, the battery cell current and the battery cell temperature is in each case transmitted to the bus system in a data set. In the following method step, the control device generates a control signal and sends said control signal to the measurement device in order to initialize a second measurement cycle, S4. Within the second measurement cycle, the measurement device again records measurement data relating to the three measurement variables of the battery cell, but this is done with a second measurement data resolution A2, where $A_2<A_1$, S5. In other words, the measurement data resolution in method step S5 is lower than in method step S2. During the first measurement cycle, that is to say in method step S2, the measurement variables of the battery cells are therefore detected more accurately by the measurement device than during the second measurement cycle in method step S5. The measurement data which is recorded during the second measurement cycle is transmitted or copied to the bus system at a second measurement frequency $f_2$ in the next method step S6, likewise within the second measurement cycle. In this case, $f_2>f_1$. That is to say, the measurement data is transmitted to the bus system with the measurement data resolution $A_2$ at a higher measurement frequency $f_2$ than is performed for the measurement data with the measurement data resolution $A_1$ during the first measurement cycle.

In this exemplary embodiment of a method according to the disclosure, an optional third measurement cycle is carried out within the scope of said method, said third measurement cycle being initialized, however, by the control device sending a measurement signal to the measurement device, S7. In the third measurement cycle S8, the measurement device detects the measurement data relating to the three measurement variables of the battery cell once again, wherein the measurement data has a measurement data resolution $A_3$ which is greater than the second measurement data resolution $A_2$ but is lower than the first measurement data resolution $A_1$, that is to say $A_2<A_3<A_1$. In the last method step S9, the measurement data which is detected within the third measurement cycle is transmitted to the bus system at a third measurement frequency $f_3$. In this case, the third measurement frequency $f_3$ is lower than the second measurement frequency $f_2$, but greater than the first measurement frequency $f_1$. That is to say, $f_2>f_3>f_1$.

In this exemplary embodiment, the first measurement data resolution $A_1$ corresponds, purely by way of example, to the maximum selectable measurement data resolution of the measurement device, and the second measurement data resolution $A_2$ corresponds, purely by way of example, to the minimum selectable measurement data resolution of the measurement device. In other words, the measurement accuracy of the measurement device is at a maximum during the first measurement cycle, whereas it is at a minimum during the second measurement cycle. Furthermore, in this exemplary embodiment, the third measurement data resolution $A_3$ corresponds, purely by way of example, to a selectable average measurement data resolution of the measurement device which, in this exemplary embodiment, is, purely by way of example, identical to the arithmetic mean of the maximum selectable measurement data resolution and the minimum selectable measurement data resolution. In other words, in this exemplary embodiment, the following equation holds true: $A_3=(A_1+A_2)/2$. Furthermore, in this exemplary embodiment, the first measurement frequency $f_1$ corresponds to the minimum selectable measurement frequency, and the second measurement frequency $f_2$ corresponds to the maximum selectable measurement frequency of the measurement device. In other words, the highly accurate measurement data, which is recorded with the maximum measurement data resolution within the first measurement cycle, is transmitted to the bus system at the minimum selectable measurement frequency, that is to say at the lowest possible clock rate of the measurement device, whereas the inaccurate measurement data, which is recorded with the minimum measurement data resolution within the second measurement cycle, is transmitted with the maximum selectable measurement frequency, that is to say the highest possible clock rate of the measurement device. In this exemplary embodiment, the third measurement frequency $f_3$ corresponds to a selectable average measurement frequency of the at least one measurement device, said average measurement frequency being identical to the arithmetic mean of the maximum selectable measurement frequency and the minimum selectable measurement frequency of the measurement device in this exemplary embodiment.

Figure 2:
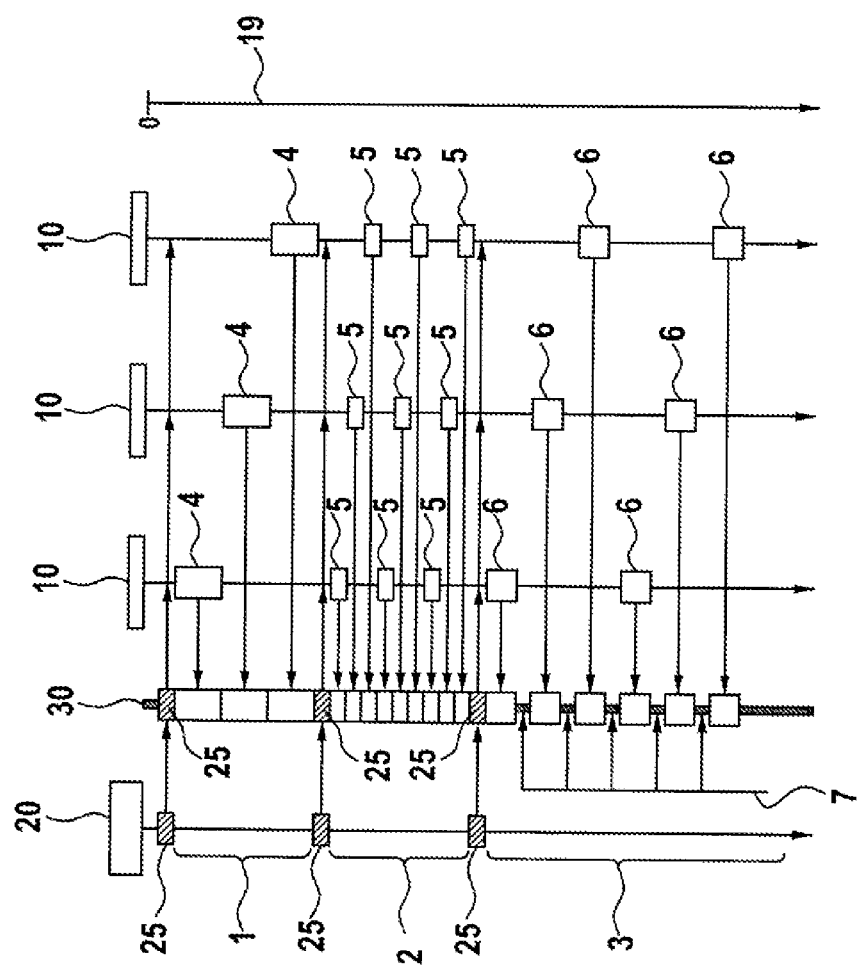
FIG. 2 shows a diagram for illustrating the sequence of a method according to the disclosure with three measurement devices.

FIG. 2 shows a diagram for explaining the sequence of a method according to the disclosure with three measurement devices 10. Said figure schematically illustrates how three measurement devices 10 communicate within the scope of the design of a method according to the disclosure with one control device 20 by means of a bus system 30. The method according to the disclosure on which FIG. 2 is based corresponds to that described in FIG. 1, with the difference that three measurement devices 10 communicate with one control device by means of a bus system 30. For this reason, the sequence of the method according to the disclosure is not explicitly repeated in the description relating to FIG. 2, but rather can be gathered from the description relating to FIG. 1.

In FIG. 2, measurement data which is transmitted to the bus system 30 and control signals are plotted as blocks of equal width, with respect to time. In the case of the measurement data illustrated in this way which is detected or generated by the measurement devices, the vertical extent of the measurement data which is illustrated as blocks diagrammatically corresponds to the measurement data resolution or to the measurement data accuracy of the measurement data, wherein a time bar 19 is shown for illustrating a time sequence. The method according to the disclosure begins by the control device 20 generating a control signal 25 and transmitting said control signal to the three measurement devices 10 by means of the bus system 30 in order to initialize the first measurement cycle 1. The first measurement cycle 1 begins after this. Within this first measurement cycle 1, the measurement data is recorded with the first, maximum selectable measurement data resolution $A_1$ of the measurement devices 10 in each case by the measurement devices 10. The measurement data 4 which is in each case recorded by the measurement devices 10 at the first, maximum measurement data resolution is transmitted to the bus system 30 at the first, minimum selectable measurement frequency of the measurement devices. On account of the high measurement data resolution, the measurement data 4 which is in each case recorded by the measurement devices 10 with the first, maximum measurement data resolution has a large scope, for which reason only one measurement data set can be generated and transmitted to the bus system 30 by each measurement device 10 within the first measurement cycle 1. After the first measurement cycle 1 is complete, the control device 20 generates a further control signal 25 and again transmits said control signal to the three measurement devices 10 by means of the bus system 30 and in this way initializes a second measurement cycle 2. Within this second measurement cycle 2, the measurement data is recorded in each case by the measurement devices 10 with the second, minimum selectable measurement data resolution $A_2$ of the measurement devices 10. The measurement data 5 which is in each case recorded by the measurement devices 10 with the second, minimum measurement data resolution is transmitted to the bus system 30 at the second, maximum selectable measurement frequency of the measurement devices 10. On account of the low measurement data resolution, the measurement data 5 which is in each case recorded by the measurement devices 10 with the second, minimum measurement data resolution has a small scope, for which reason in each case three measurement data sets can be generated and transmitted to the bus system 30 by each measurement device 10 within the second measurement cycle 1. The high measurement frequency required for this purpose is provided at the second, maximum selectable measurement frequency $f_2$ of the method according to the disclosure. After the second measurement cycle 2 is complete, the control device 20 generates a last control signal 25 and, as before, transmits said control signal to the three measurement devices 10 by means of the bus system 30 and in this way initializes a third measurement cycle 3. Within this third measurement cycle 3, the measurement data is recorded in each case by the measurement devices 10 with the selectable third average measurement data resolution $A_3$ of the measurement devices 10. The measurement data 6 which is in each case recorded by the measurement devices 10 with the third, average measurement data resolution is transmitted to the bus system 30 at the selectable third, average measurement frequency of the measurement devices 10. On account of the selection of the average measurement data resolution and the average measurement frequency, the measurement data 6 which is in each case recorded by the measurement devices 10 with the third, average measurement data resolution has an average scope, for which reason in each case two measurement data sets can be generated and transmitted to the bus system 30 by each measurement device 10 within the third measurement cycle 1. Free spaces 7 are then produced on the bus system 30 between the measurement data sets which are transmitted to the bus system 30 by the measurement devices 10, since the bus system 30 is no longer completely used for transmitting the measurement data sets. These free spaces 7 on the bus system can then be used, for example, for communicating or transmitting further control signals to the measurement devices 10.

In all of the exemplary embodiments illustrated here, both the selection of the value of the first, second and third measurement frequency $f_1$, $f_2$ and $f_3$ and also of the first, second and third measurement data resolution $A_1$, $A_2$ and $A_3$ is selected as an option and purely by way of example. It is also possible to implement methods according to the disclosure in which the first and the second measurement data resolution $A_1$ and $A_2$ do not correspond to the maximum and, respectively, minimum selectable measurement data resolution of a measurement device 10. Furthermore, it is not necessary for the third measurement data resolution $A_1$ to correspond to the arithmetic mean of the maximum and the minimum selectable measurement data resolution of a measurement device 10 either, but it may rather correspond, for example, to another average or to another variable. It is also not necessary for the first measurement frequency $f_1$ to correspond to the minimum selectable measurement frequency or for the second measurement frequency $f_2$ to correspond to the maximum selectable measurement frequency of a measurement device 10. Other measurement frequencies which are provided by a measurement device 10 can in each case be selected for both measurement frequencies $f_1$ and $f_2$. The manner in which the third measurement frequency $f_3$ is selected can also differ from that of this exemplary embodiment. Furthermore, a first, second or third measurement cycle 1, 2, 3 can also be initialized by a unit other than the control device 20, for example by the measurement device itself or by any other desired unit. A method according to the disclosure can also be executed by a unit other than a control device 20 and the method can also be implemented within a system which is not a battery management system. For example, methods according to the disclosure in which the measurement devices 10 are designed to record measurement data relating to one or more measurement variables which do not correspond to a measurement variable of a battery cell can also be realized. A measurement device can also be connected to more than one battery cell, for example to a battery module or a battery, and be designed for the purpose of recording measurement data relating to a measurement variable of a battery.

What is claimed is:

1. A method for transmitting data between a control device and at least one measurement device via a bus system, comprising:
   initializing a first measurement cycle;
   recording first measurement data relating to at least one measurement variable with the at least one measurement device with a first measurement data resolution within the first measurement cycle;
   transmitting the recorded first measurement data to the bus system at a first measurement frequency within the first measurement cycle;
   initializing a second measurement cycle;
   recording second measurement data relating to the at least one measurement variable with the at least one measurement device with a second measurement data resolution within the second measurement cycle, the second measurement data resolution being less than the first measurement data resolution; and
   transmitting the recorded second measurement data to the bus system at a second measurement frequency within the second measurement cycle, the second measurement frequency being greater than the first measurement frequency.

2. The method for transmitting data according to claim 1, further comprising:
   initializing a third measurement cycle;
   recording third measurement data relating to the at least one measurement variable with the at least one measurement device with a third measurement data resolution within the third measurement cycle, the third measurement data resolution being greater than the second measurement data resolution and the third measurement data resolution being less than the first measurement data resolution; and
   transmitting the recorded third measurement data to the bus system at a third measurement frequency within the third measurement cycle, the third measurement frequency being less than the second measurement frequency and the third measurement frequency being greater than the first measurement frequency.

3. The method for transmitting data according to claim 2, wherein at least one of the first measurement cycle, the second measurement cycle, and the third measurement cycle is initialized by a control signal in each case being generated by the control device and being transmitted to the at least one measurement device.

4. The method for transmitting data according to claim 1, wherein at least one of the following conditions exist:
   the first measurement data resolution corresponds to a maximum selectable measurement data resolution,
   the second measurement data resolution corresponds to a minimum selectable measurement data resolution, and
   the third measurement data resolution corresponds to a selectable average measurement data resolution of the at least one measurement device.

5. The method for transmitting data according to claim 4, wherein the average measurement data resolution is given by an arithmetic mean of the minimum selectable measurement data resolution and the maximum selectable measurement data resolution.

6. The method for transmitting data according to claim 2, wherein at least one of the following conditions exist:

the first measurement frequency corresponds to a minimum selectable measurement frequency,
the second measurement frequency corresponds to a maximum selectable measurement frequency, and
the third measurement frequency corresponds to a selectable average measurement frequency of the at least one measurement device.

7. The method for transmitting data according to claim 6, wherein the average measurement frequency is given by an arithmetic mean of the maximum selectable measurement frequency and the minimum selectable measurement frequency.

8. The method for transmitting data according to claim 1, wherein a battery management unit is configured to execute the method.

9. A battery comprising:
a battery management unit configured to execute a method for transmitting data between a control device and at least one measurement device via a bus system, the method including
    initializing a first measurement cycle,
    recording first measurement data relating to at least one measurement variable with the at least one measurement device with a first measurement data resolution within the first measurement cycle,
    transmitting the recorded first measurement data to the bus system at a first measurement frequency within the first measurement cycle,
    initializing a second measurement cycle,
    recording second measurement data relating to the at least one measurement variable with the at least one measurement device with a second measurement data resolution within the second measurement cycle, the second measurement data resolution being less than the first measurement data resolution, and
    transmitting the recorded second measurement data to the bus system at a second measurement frequency within the second measurement cycle, the second measurement frequency being greater than the first measurement frequency.

10. A motor vehicle comprising:
a drive system; and
a battery connected to the drive system, the battery including a battery management unit configured to execute a method for transmitting data between a control device and at least one measurement device via a bus system, the method including
    initializing a first measurement cycle,
    recording first measurement data relating to at least one measurement variable with the at least one measurement device with a first measurement data resolution within the first measurement cycle,
    transmitting the recorded first measurement data to the bus system at a first measurement frequency within the first measurement cycle,
    initializing a second measurement cycle,
    recording second measurement data relating to the at least one measurement variable with the at least one measurement device with a second measurement data resolution within the second measurement cycle, the second measurement data resolution being less than the first measurement data resolution, and
    transmitting the recorded second measurement data to the bus system at a second measurement frequency within the second measurement cycle, the second measurement frequency being greater than the first measurement frequency.

* * * * *